(12) United States Patent
Wang et al.

(10) Patent No.: US 12,211,701 B2
(45) Date of Patent: Jan. 28, 2025

(54) GATE STRUCTURE OF SEMICONDUCTOR DEVICE AND METHOD OF MANUFACTURE

(71) Applicant: Taiwan Semiconductor Manufacturing Co., Ltd., Hsinchu (TW)

(72) Inventors: Tsan-Chun Wang, Hsinchu (TW); Chun-Feng Nieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 261 days.

(21) Appl. No.: 17/838,524

(22) Filed: Jun. 13, 2022

(65) Prior Publication Data

US 2022/0310405 A1   Sep. 29, 2022

Related U.S. Application Data

(60) Continuation of application No. 16/983,581, filed on Aug. 3, 2020, now Pat. No. 11,361,977, which is a
(Continued)

(51) Int. Cl.
*H01L 29/78* (2006.01)
*C23C 14/48* (2006.01)
(Continued)

(52) U.S. Cl.
CPC .......... *H01L 21/3215* (2013.01); *C23C 14/48* (2013.01); *H01J 37/3171* (2013.01);
(Continued)

(58) Field of Classification Search
CPC ............. H01L 21/3215; H01L 21/3115; H01L 21/31155; H01L 21/02321; H01L 21/28176; H01L 29/7851; H01L 29/517; H01L 29/4966; H01L 29/66795–66818; H01L 21/28088; H01L 21/823431; H01L 29/785–7856; H01L 21/24; H01L 21/56;
(Continued)

(56) References Cited

U.S. PATENT DOCUMENTS 9,627,484 B1 *  4/2017  Ando ................. H01L 21/0217
9,679,985 B1    6/2017  Wu et al.
(Continued)

FOREIGN PATENT DOCUMENTS

CN   105280466 A    1/2016
CN   105990240 A    10/2016
(Continued)

OTHER PUBLICATIONS

Vorlesungsskript, Tu-C., et al., "Nanotransistoren in höchstintegrierten Schaltungen: SOI FET und FinFET," 25 pages.

*Primary Examiner* — Shahed Ahmed
(74) *Attorney, Agent, or Firm* — Slater Matsil, LLP

(57) ABSTRACT

A semiconductor device and method of manufacture are provided. In some embodiments a divergent ion beam is utilized to implant ions into a capping layer, wherein the capping layer is located over a first metal layer, a dielectric layer, and an interfacial layer over a semiconductor fin. The ions are then driven from the capping layer into one or more of the first metal layer, the dielectric layer, and the interfacial layer.

20 Claims, 9 Drawing Sheets

Related U.S. Application Data continuation of application No. 16/193,433, filed on Nov. 16, 2018, now Pat. No. 10,741,412, which is a division of application No. 15/687,287, filed on Aug. 25, 2017, now Pat. No. 10,163,657.

(51) Int. Cl.

| | |
|---|---|
| *H01J 37/317* | (2006.01) |
| *H01L 21/02* | (2006.01) |
| *H01L 21/28* | (2006.01) |
| *H01L 21/3115* | (2006.01) |
| *H01L 21/3215* | (2006.01) |
| *H01L 29/49* | (2006.01) |
| *H01L 29/51* | (2006.01) |
| *H01L 29/66* | (2006.01) |

(52) U.S. Cl.
CPC .. *H01L 21/02321* (2013.01); *H01L 21/28176* (2013.01); *H01L 21/3115* (2013.01); *H01L 21/31155* (2013.01); *H01L 29/4966* (2013.01); *H01L 29/517* (2013.01); *H01L 29/66795* (2013.01); *H01L 29/7851* (2013.01); *H01L 21/28088* (2013.01)

(58) Field of Classification Search
CPC ....... H01L 2029/7857–7858; H01L 21/28247; H01L 21/76834; H01L 21/0415; C23C 14/48; H01J 37/3171
See application file for complete search history.

(56) References Cited

U.S. PATENT DOCUMENTS

| | | | |
|---|---|---|---|
| 2008/0179695 A1* | 7/2008 | Berthold | H01L 21/2658 257/408 |
| 2009/0004805 A1 | 1/2009 | Nandakumar et al. | |
| 2010/0096705 A1 | 4/2010 | Hung et al. | |
| 2011/0169084 A1 | 7/2011 | Yang et al. | |
| 2012/0070953 A1* | 3/2012 | Yu | H01L 29/66803 438/301 |
| 2015/0079750 A1 | 3/2015 | Wang et al. | |
| 2015/0079752 A1 | 3/2015 | Wu et al. | |
| 2016/0133469 A1* | 5/2016 | Wan | H01J 37/3171 438/525 |
| 2016/0315191 A1 | 10/2016 | Tsai et al. | |
| 2017/0062211 A1 | 3/2017 | Lim et al. | |
| 2017/0170027 A1 | 6/2017 | Hou et al. | |
| 2019/0006242 A1 | 1/2019 | Wang et al. | |
| 2019/0006492 A1* | 1/2019 | Wang | H01L 21/266 |

FOREIGN PATENT DOCUMENTS

| | | |
|---|---|---|
| CN | 106972049 A | 7/2017 |
| KR | 20170024482 A | 3/2017 |
| TW | 201312751 A | 3/2013 |
| TW | 201618164 A | 5/2016 |
| WO | 2016179113 A1 | 11/2016 |

\* cited by examiner

GATE STRUCTURE OF SEMICONDUCTOR DEVICE AND METHOD OF MANUFACTURE

PRIORITY CLAIM AND CROSS-REFERENCE

This application is a divisional of U.S. patent application Ser. No. 16/983,581, filed on Aug. 3, 2020, now U.S. Pat. No. 11,361,977, issued on Jun. 14, 2022, which is a continuation of U.S. patent application Ser. No. 16/193,433, filed on Nov. 16, 2018, now U.S. Pat. No. 10,741,412, issued on Aug. 11, 2020, which is a divisional and claims the benefit of U.S. patent application Ser. No. 15/687,287, filed on Aug. 25, 2017, now U.S. Pat. No. 10,163,657, issued on Dec. 25, 2018, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
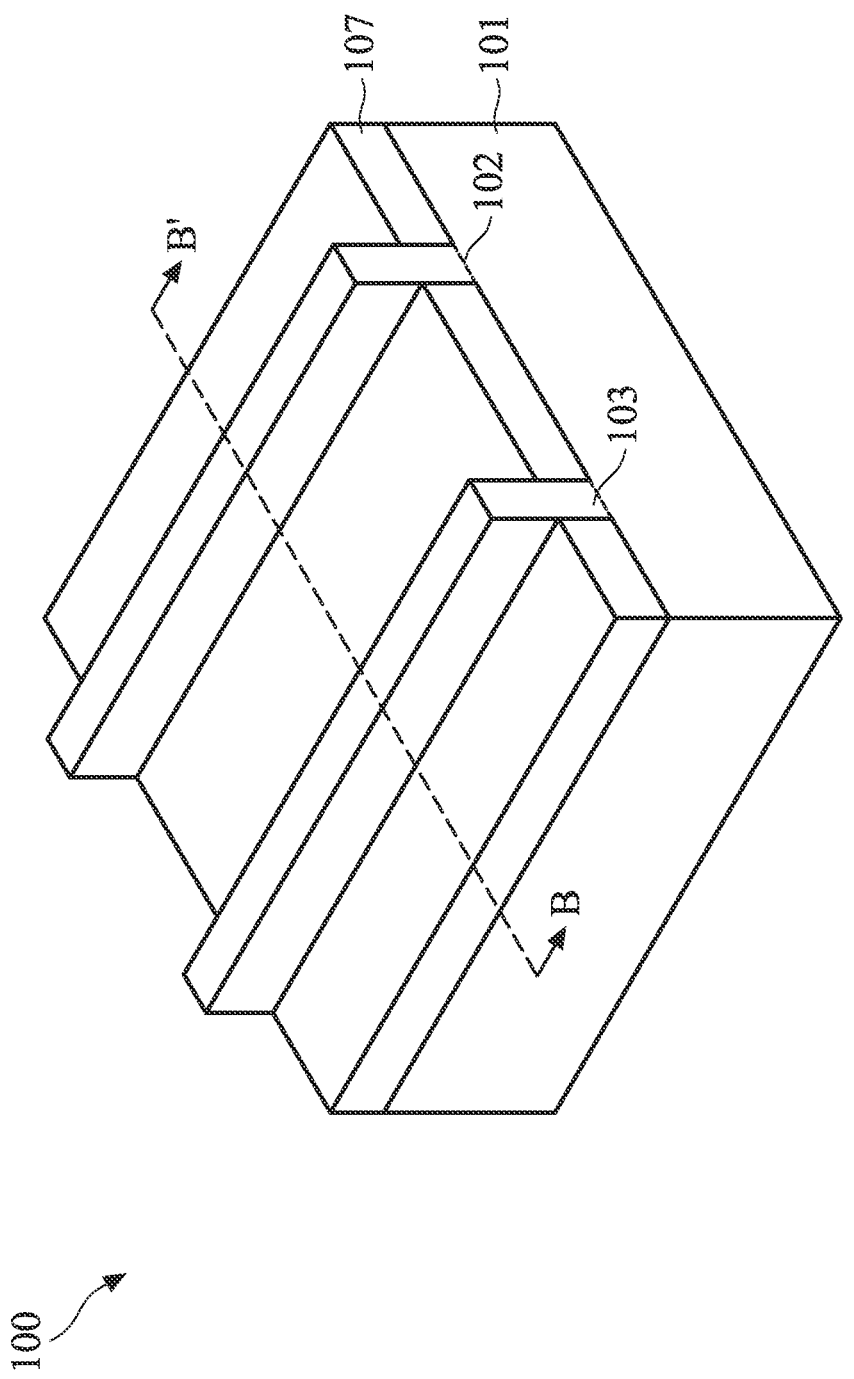
FIGS. 1A-1B illustrate a semiconductor fin over a substrate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below with respect to a semiconductor manufacturing process node such as a 20 nm process node, a 9 nm process node, a 7 nm process node, or the like, in which a metal gate may be fabricated using an implantation process in order to enhance the metal gate and channel performance. However, the embodiments described may be utilized in a wide variety of processes and devices, and are not limited to the embodiments listed above.

Figure 1B:
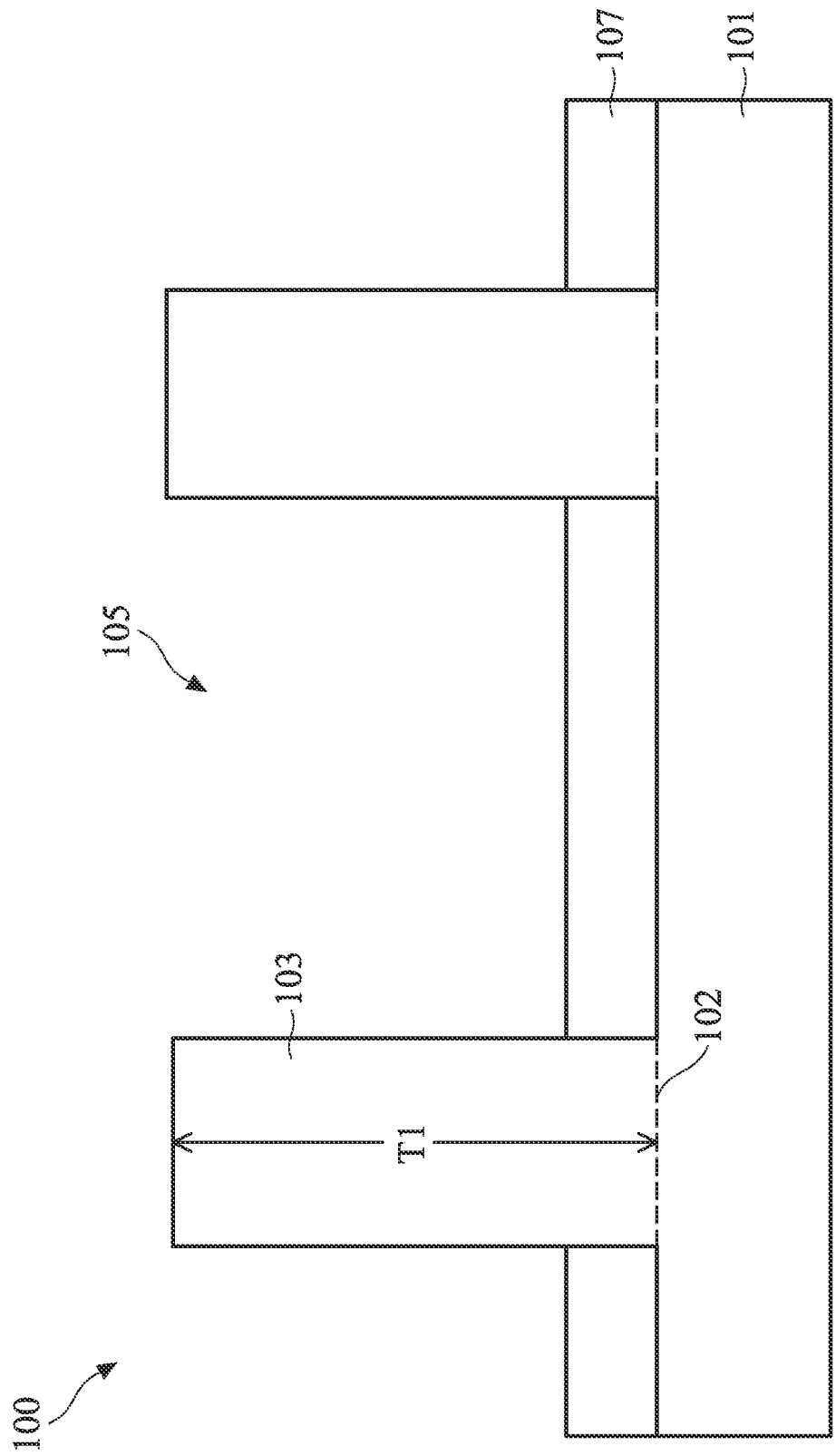

With reference now to FIGS. 1A-1B, there is illustrated a semiconductor device 100 which includes a substrate 101 with fins 103 (denoted as separate from the rest of the substrate 101 by dashed line 102) located between first trenches 105 formed within the substrate 101, and first isolation regions 107 within the first trenches 105. In an embodiment the substrate 101 may comprise, for example, bulk silicon, doped or undoped, germanium, a III-V material (such as gallium arsenide, indium arsenide, or the like), or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The fins 103 and the first trenches 105 may be formed from the substrate 101. In an embodiment the fins 103 may be formed from the substrate 101 by initially forming a patterned mask (not separately illustrated in FIGS. 1A-1B) over the substrate 101. The material of the patterned mask, such as silicon nitride, silicon oxide, combinations of these, or the like, is subsequently patterned using, for example, photolithography techniques. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask to define the fins 103 and the first trenches 105.

Once the patterned mask has been formed, the fins 103 may be formed using a subtractive etching process along with the patterned mask 106 in order to form a raised portion with sidewalls, wherein the sidewalls may comprise a (001) surface. For example, exposed portions of the substrate 101 may be etched to form the fins 103 and the first trenches 105 from the substrate 101. In an embodiment the substrate 101 may be etched by, for example, $HBr/O_2$, $HBr/Cl_2/O_2$, or $SF_6/C_{12}$ plasma. In an embodiment the fins 103 may be patterned such that it will eventually be used for a channel in a semiconductor device such as a fin field effect transistor (FinFET).

However, as one of ordinary skill in the art will recognize, the subtractive process described above to form the fins 103 is intended to be illustrative and is not intended to limit the embodiments. Rather, any suitable process, such as an epitaxial growth process using the substrate 101 and a mask, may be utilized to form the fins 103. Any suitable process for forming the fins 103 from the substrate 101 may be utilized, and all such processes are fully intended to be included within the scope of the embodiments.

Once the first trenches 105 and the fins 103 have been formed, the first trenches 105 may be filled with a dielectric material and the dielectric material may be recessed within the first trenches 105 to form the first isolation regions 107. The dielectric material may be an oxide material, a high-density plasma (HDP) oxide, or the like. The dielectric material may be formed, after an optional cleaning and lining of the first trenches 105, using either a chemical vapor deposition (CVD) method (e.g., the HARP process), a high density plasma CVD method, or other suitable method of formation as is known in the art.

The first trenches 105 may be filled by overfilling the first trenches 105 and the substrate 101 with the dielectric material and then removing the excess material outside of the first trenches 105 and the fins 103 through a suitable process such as chemical mechanical polishing (CMP), an etch, a combination of these, or the like. In an embodiment, the removal process removes any dielectric material that is located over the fins 103 as well, so that the removal of the dielectric material will expose the surface of the fins 103 to further processing steps.

Once the first trenches 105 have been filled with the dielectric material, the dielectric material may then be recessed away from the surface of the fins 103. The recessing may be performed to expose at least a portion of the sidewalls of the fins 103 adjacent to the top surface of the fins 103. The dielectric material may be recessed using a wet etch by dipping the top surface of the fins 103 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 103 of between about 50 Å and about 500 Å, such as about 400 Å. Additionally, the recessing may also remove any leftover dielectric material located over the fins 103 to ensure that the fins 103 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 105 with the dielectric material. All of the potential process steps are fully intended to be included within the scope of the present embodiment.

Figure 2:
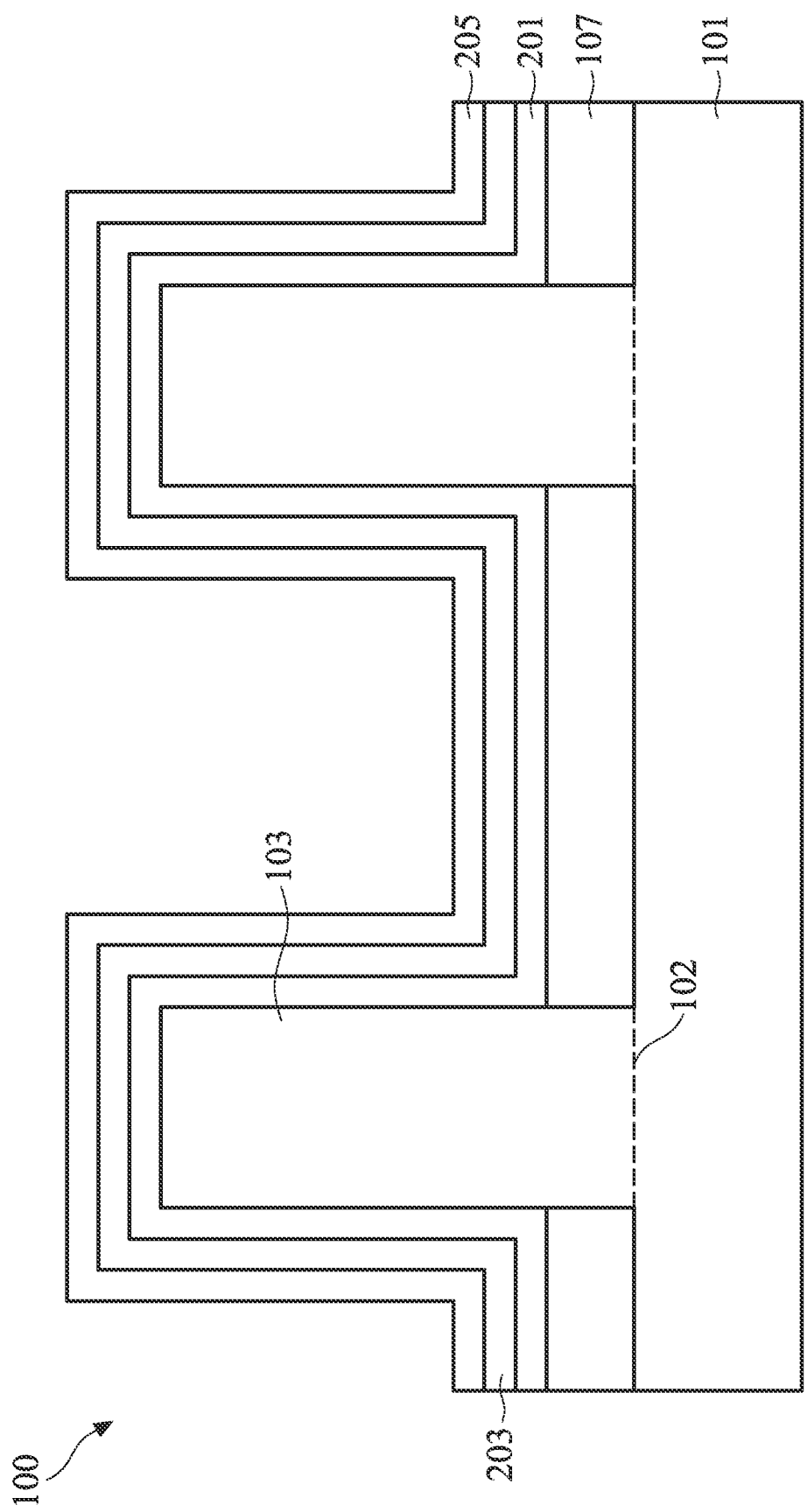
FIG. 2 illustrates a deposition of an interfacial layer, a dielectric layer and a first metal layer in accordance with some embodiments.

FIG. 2 illustrates a placement of an interfacial layer 201, a high-k dielectric layer 203, and a first metal layer 205 over the fins 103. In an embodiment the interfacial layer 201 is utilized to reduce damage between the fins 103 and, e.g., the high-k dielectric layer 203 (described further below). In an embodiment the interfacial layer 201 comprises a buffer material such as silicon oxide, although any suitable material may be utilized. The interfacial layer 201 may be formed using a process such as CVD, PVD, or even oxidation of the fins 103 to a thickness of between about 1 Å and about 20 Å, such as about 9 Å. However, any suitable process or thicknesses may be utilized.

Once the interfacial layer 201 has been formed, the high-k dielectric layer 203 may be formed over the interfacial layer 201. In an embodiment the high-k dielectric layer 203 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The high-k dielectric layer 203 may be deposited to a thickness of between about 5 Å and about 200 Å, such as about 16 Å, although any suitable material and thickness may be utilized.

The first metal layer 205 may be formed adjacent to the high-k dielectric layer 203 and may be formed from a metallic material such as TiN, TiAlN, TaC, TaCN, TaSiN, Mn, Zr, Ti, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal layer 205 may be deposited using a deposition process such as atomic layer deposition, chemical vapor deposition, sputtering, or the like, to a thickness of between about 5 Å and about 200 Å, such as about 16 Å, although any suitable deposition process or thickness may be used.

Figure 3:
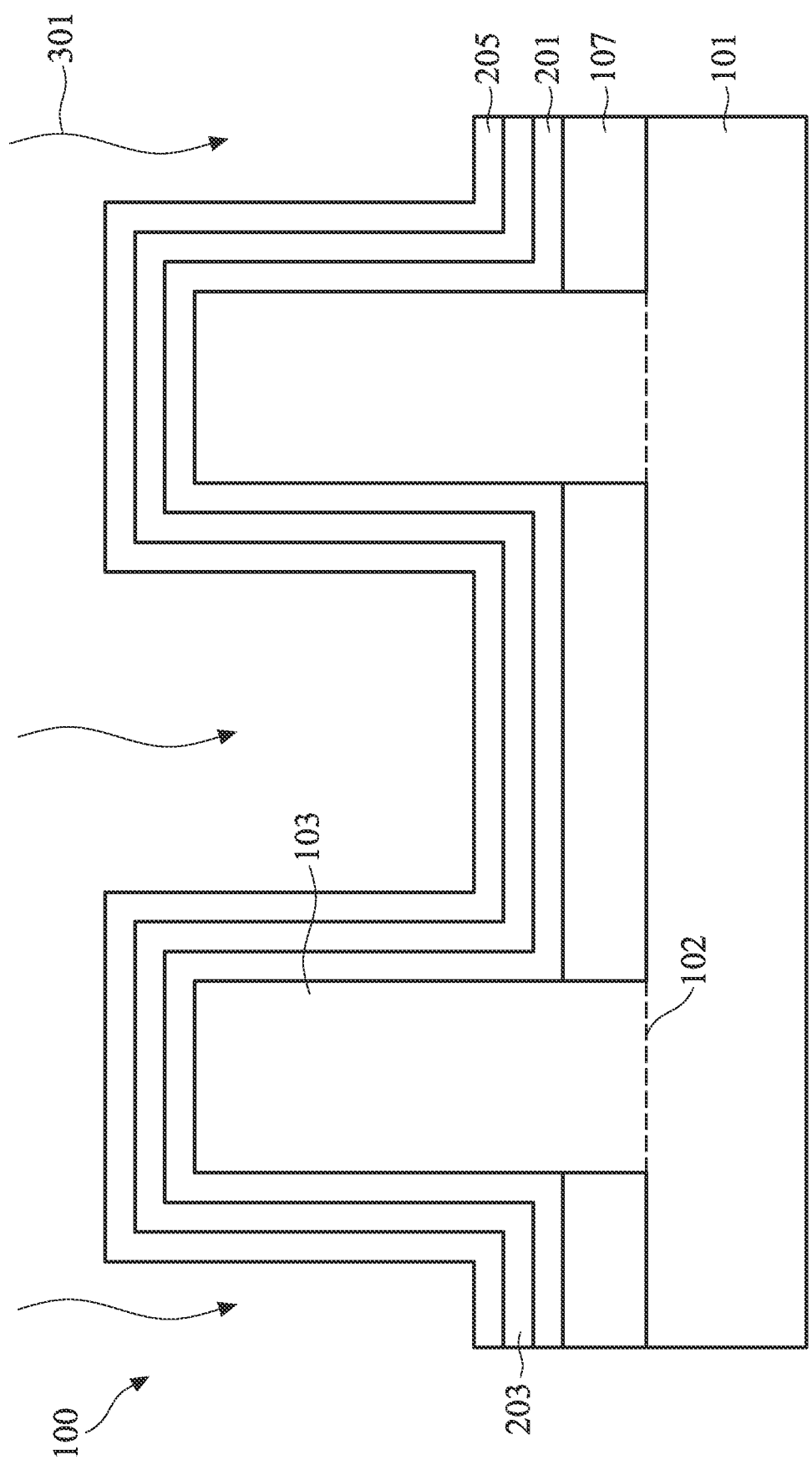
FIG. 3 illustrates a first annealing process in accordance with some embodiments.

FIG. 3 illustrates that, after the first metal material 205 has been formed, a first anneal process (represented in FIG. 3 by the wavy lines labeled 301) may be performed. In an embodiment the first anneal process 301 may be a thermal anneal wherein the substrate 101 is heated within, e.g., a furnace, within an inert atmosphere. The first anneal process 301 may be performed at a temperature of between about 600° C. and about 900° C., such as about 850° C., and may be continued for a time of between about 1 s and about 1 min, such as about 0.5 min.

Figure 4:
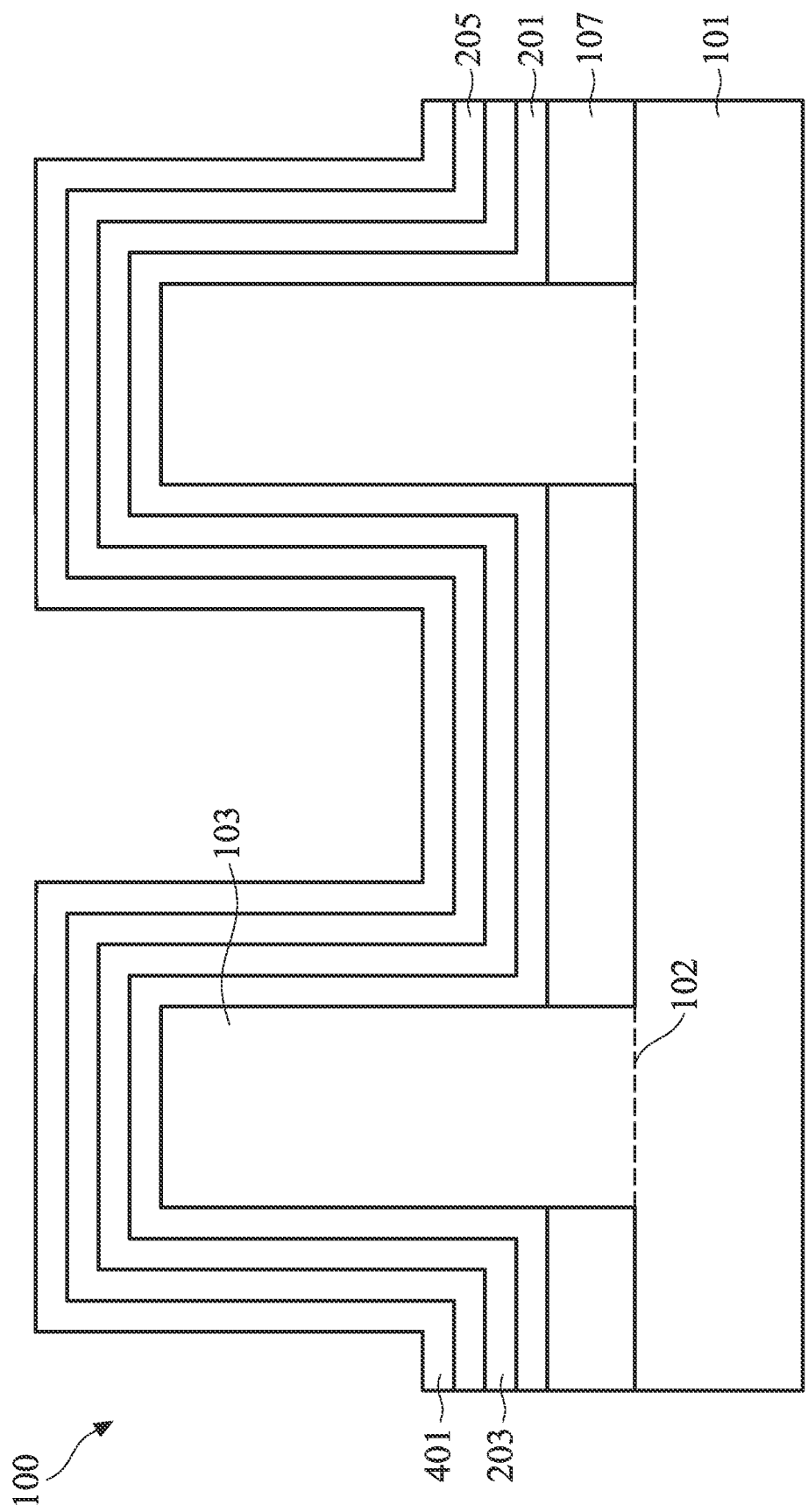
FIG. 4 illustrates a deposition of a capping layer in accordance with some embodiments.

FIG. 4 illustrates that, once the first anneal process 301 has been completed, a capping layer 401 is formed over the first metal layer 205 in order to protect the underlying first metal layer 205 from being damaged in subsequent processing. In an embodiment the capping layer 401 is silicon, although other suitable materials, such as SiN, SiCN, SiON, SiC, Si-rich oxide, combinations thereof, or the like, may be utilized, and the capping layer 401 may be formed by CVD, spin-on-glass process, flow-able CVD, atomic layer deposition (ALD), molecular layer deposition (MLD), or the like. The capping layer 401 may be formed to a thickness of between about 5 Å and about 40 Å, such as about 30 Å. However, any other suitable materials, processes, and thicknesses may be utilized.

Figure 5A:
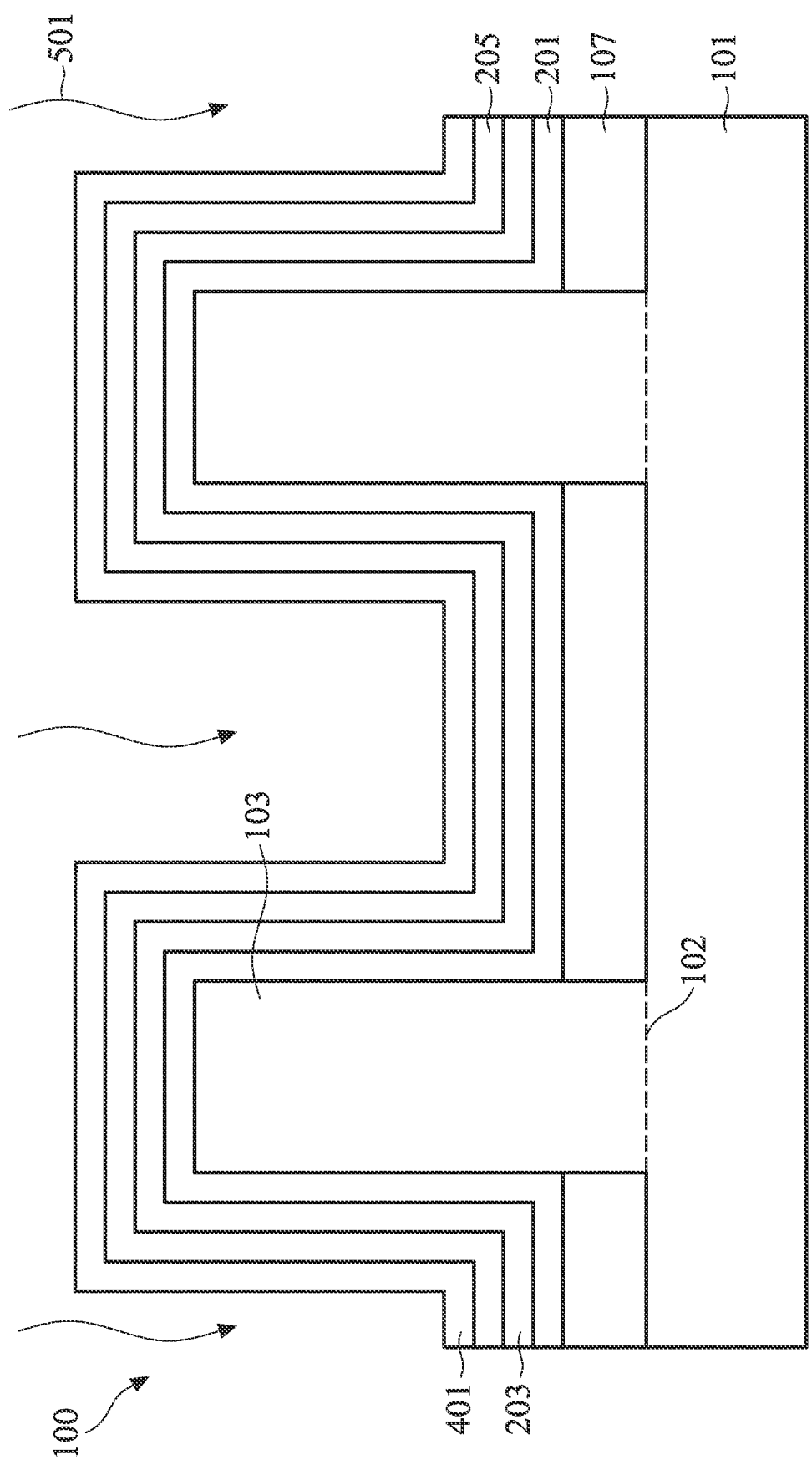
FIGS. 5A-5B illustrate an implantation process in accordance with some embodiments.
Figure 5B:
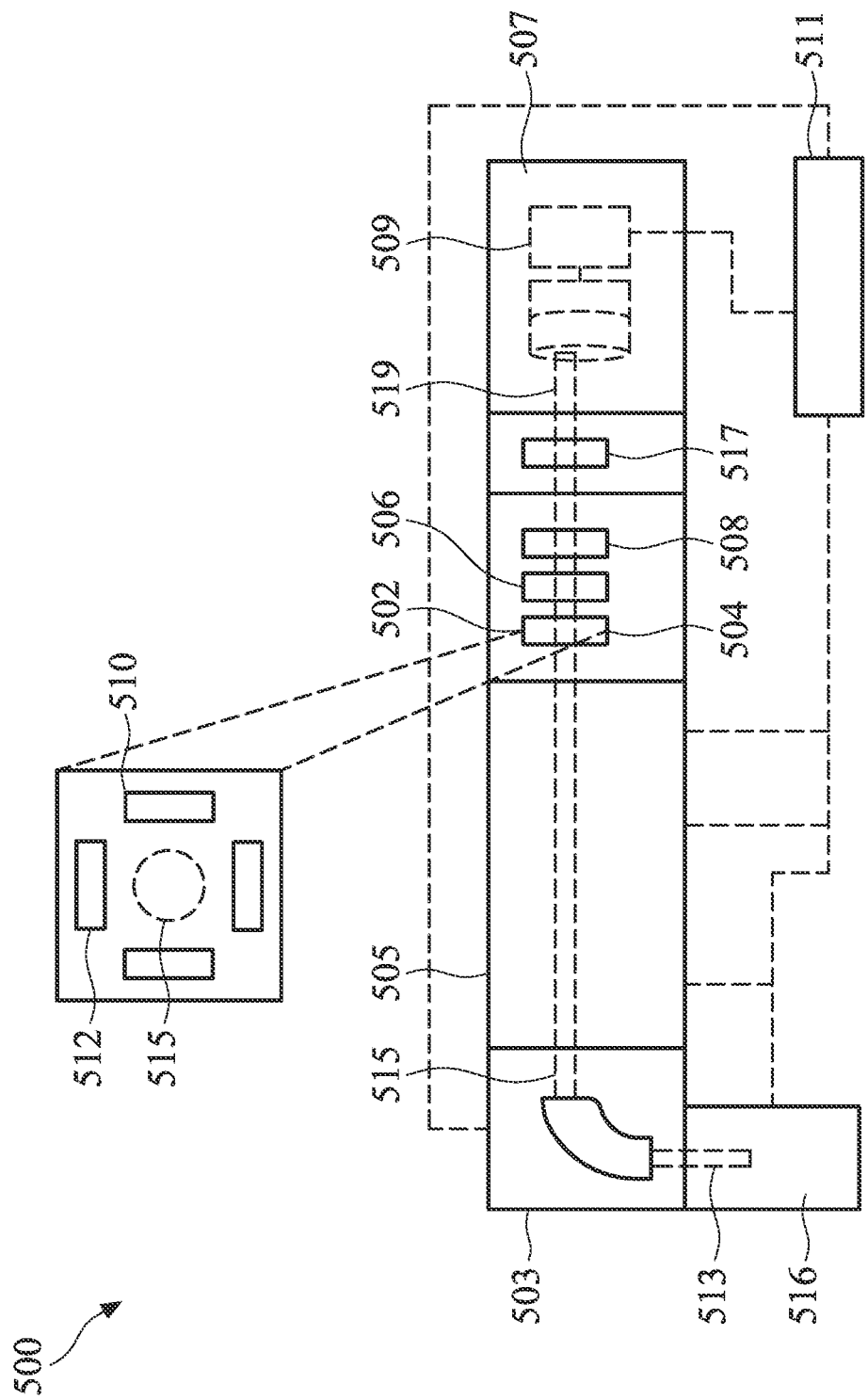

FIGS. 5A-5B illustrate an implantation process (represented in FIG. 5A by the lines labeled 501) that is utilized to help incorporate a first dopant into the fins 103, the interfacial layer 201, the high-k dielectric layer 203, and the first metal layer 205 by initially implanting the first dopant into the capping layer 401. In an embodiment the first dopant is a material which can help to reduce the number of oxygen vacancies, reduce the number of silicon dangling bonds, or help to mitigate weak silicon-hydrogen bonding, each of which can degrade the overall performance of the semiconductor device 100. For example, in embodiments in which the fins 103, the first metal layer 205 is titanium nitride, the high-k dielectric layer 203 is hafnium oxide, and the interfacial layer 201 is silicon oxide, the first dopant to be implanted may be fluorine, although any other suitable dopants, such as carbon and nitrogen, may be utilized.

FIG. 5B illustrates an ion implanter 500 which may be utilized during the ion implantation process 501 to implant the first dopant into the capping layer 401. In an embodiment the ion implanter 500 may include an ion source 516 a mass analysis magnet 503, a linear accelerator 505, a convergence unit 502, an aperture 517, an end station 507, a wafer handling unit 509 and a controller 511 to control the operation of the ion implanter 500. Each of these pieces will be discussed in the following paragraphs.

The ion source 516 produces an ion beam 513. However, as the ion source 516 produces ions having a range of charge-to-mass ratio, and only a certain range of ions are suitable for implantation, the ion beam 513 is directed towards the mass analysis magnet 503 in order to electromagnetically separate those ions having a desired charge-to-mass ratio for implantation from those ions having an undesired charge-to-mass ratio. Once a coherent ion beam 515 of suitable charge-to-mass ratio is obtained, the coherent ion beam 515 is sent to the linear accelerator 505.

The linear accelerator 505 is used to impart additional energy to the coherent ion beam 515 as it passes through the linear accelerator 505. The linear accelerator 505 imparts this additional energy using a series of electrodes (not shown) that generate an electromagnetic field which, when the coherent ion beam 515 passes through the field, works to accelerate the coherent ion beam 515. The linear accelerator 505 may vary the electromagnetic fields periodically with time or may adjust the phase of the electromagnetic fields to accommodate ions with different atomic numbers as well as ions having different initial speeds.

After the coherent ion beam 515 is passed through the linear accelerator 505, the coherent ion beam 515 is passed through the converging unit 502, which is utilized to modify the convergence and divergence of the coherent ion beam 515 (which arrives from the linear accelerator 505 as a substantially parallel beam). In an embodiment the converging unit 502 comprises one or more (such as three) multipole lenses, such as a uniformity multipole lens and a collimator multipole lens. However, any suitable number and type of lenses may be utilized.

In a particular embodiment the converging unit 502 comprises one or more quadrupole lenses. For example, the converging unit 502 may comprise three quadrupole lenses, such as a first quadrupole lens 504, a second quadrupole lens 506, and a third quadrupole lens 508. Each of the first quadrupole lens 504, the second quadrupole lens 506, and the third quadrupole lens 508 may separately be a magnetic field lens or an electric field lens. However, any suitable unit which can modify the convergence and divergence of the coherent ion beam 515 may be utilized.

In a particular embodiment in which the first quadrupole lens 504 is an electric field lens, the first quadrupole lens 504 comprises a first pair of electrodes 510 opposite each other in a first direction and a second pair of electrodes 512 opposite each other in a second direction perpendicular to the first direction. As such, by varying the electrical potential to the first pair of electrodes 510, a first repulsive or attractive force can be applied to the individual ions within the coherent ion beam 515 in the first direction. Additionally, by varying the electrical potential to the second pair of electrodes 512, a second repulsive or attractive force can be applied to the individual ions within the coherent ion beam 515 in the second direction. As such, the control and application of the first quadrupole lens 504 helps to control the convergence and divergence of the ions within the coherent ion beam 515.

Additionally, the second quadrupole lens 506 may be similar to the first quadrupole lens 504 (e.g., may have a first pair of electrodes and a second pair of electrodes), but may be controlled to apply electrical potentials that are opposite than the electrical potentials applied to the first pair of electrodes 510 and the second pair of electrodes 512 (within the first quadrupole lens 504). As such, the second quadrupole lens 506 can help to modify the coherent ion beam in the first direction and the second direction opposite the first quadrupole lens 504.

Finally, in an embodiment in which the converging unit 502 utilizes the third quadrupole lens 508, the third quadrupole lens 508 may be similar to the first quadrupole lens 504. For example, the third quadrupole lens 508 may have a first pair of electrodes and a second pair of electrodes, and may be controlled by applying electrical potentials that are similar, if not the same, as the electrical potentials applied to the first pair of electrodes 510 and the second pair of electrodes 512 (within the first quadrupole lens 504). However, in other embodiments the third quadrupole lens 508 may be different from the first quadrupole lens 504.

After the coherent ion beam 515 has passed through the converging unit 502, the coherent ion beam 515 passes through an aperture 517 in order to further enhance and control the divergence of the coherent ion beam 515. In an embodiment the aperture 517 is an aperture with an adjustable width that can adjust the magnitude of the coherent ion beam 515. For example, the aperture 517 may comprise adjustable and movable plates such that a spacing between the plates can be adjusted, thereby allowing for an adjustment of the beam current magnitude.

Additionally, if desired, a chicane (not separately illustrated in FIG. 5B) may be utilized between the converging unit 502 and the end station 507. In an embodiment the chicane is utilized to direct and bend the path of the coherent ion beam 515 to the desired finalized location (e.g., onto the substrate 101). However, any suitable device may be utilized.

Once the coherent ion beam 515 has been accelerated (through the linear accelerator 505) and the divergence of the coherent ion beam 515 has been modified (through the convergence unit 502), the coherent ion beam 515 is directed towards the end station 507. The end station 507 may house the wafer handling unit 509, which handles the substrate 101 which will be implanted with ions from the coherent ion beam 515. The wafer handling unit 509 is utilized to move the substrate 101 in relation to the coherent ion beam 515 so as to illuminate different sections of the substrate 101 with the coherent ion beam 515. For example, the wafer handling unit 509 may comprise two motors (not shown) which may be used to control the position of the substrate 101 in at least two directions, such as an x-direction and a y-direction, relative to the coherent ion beam 515.

However, as one of ordinary skill in the art will recognize, moving the substrate 101 in relation to the coherent ion beam 515 is merely one exemplary method of illuminating different sections of the substrate 101 with the coherent ion beam 515. Other suitable methods, such as the use of deflection electrodes along the path of the coherent ion beam 515 to shift the direction of the coherent ion beam 515 in relation to the substrate 101 instead of shifting the substrate 101 in relation to the coherent ion beam 515, using a multiple wafer rotating system to illuminate multiple wafers in order, or using angular implantation methods, may also be utilized. These methods, and any other suitable method for illuminating different portions of the substrate 101 with the coherent ion beam 515, are fully intended to be included within the scope of the present disclosure.

The controller 511 is used to control the operating parameters of the ion implanter 500 during operation. The controller 511 may be implemented in either hardware or software, and the parameters may be hardcoded or fed into the controller 511 through an input port. The controller 511 may be used to store and control parameters associated with the operation of the ion implanter 500, such as the desired ion beam current, the current to the accelerator electrodes, and the like. Additionally, the controller 511 may also be used to control the wafer handling unit 509 and, more specifically, the velocity of the motors of the wafer handling unit 509, which, in turn, control the velocity of the substrate 101 with respect to the coherent ion beam 515.

With reference now to both FIGS. 5A-5B, in order to implant the first dopant (e.g., fluorine ions) into the capping layer 401, the substrate 101 is placed on the wafer handling unit 509 and the coherent ion beam 515 is generated. Additionally, as the coherent ion beam 515 passes through the convergence unit 502 and the aperture 517, the coherent ion beam 515 is turned into a divergent ion beam 519. In an embodiment the divergent ion beam 519 has an intensity divergence from parallel of between about ±0.1° to about ±20°, such as about ±10°. However, any suitable divergence that is greater than 0° may be utilized.

Additionally, the ion implantation process 501 may be performed at an energy level that allows for an implantation of the first dopants into the capping layer 401, but helps to minimize or prohibit damage being done to the underlying layers (e.g., the first metal layer 205, the high-k dielectric layer 203, the interfacial layer 201, and the fins 103). For example, in an embodiment the ion implantation process 501 may be performed with a sub-keV implantation, such as about 300 eV. However, any suitable implantation power may be utilized.

By utilizing the divergent ion beam 519 (instead of a parallel ion beam), a better conformality of the first dopants may be achieved within the capping layer 401. For example, in an embodiment the first dopants may be implanted within the capping layer 401 at an area concentration of the ion implanter at a tilt of zero degrees of between about $5 \times 10^{13}$ atoms/cm$^2$ and about $5 \times 10^{15}$ atoms/cm$^2$, such as about $8 \times 10^{14}$ atoms/cm$^2$.

Figure 6:
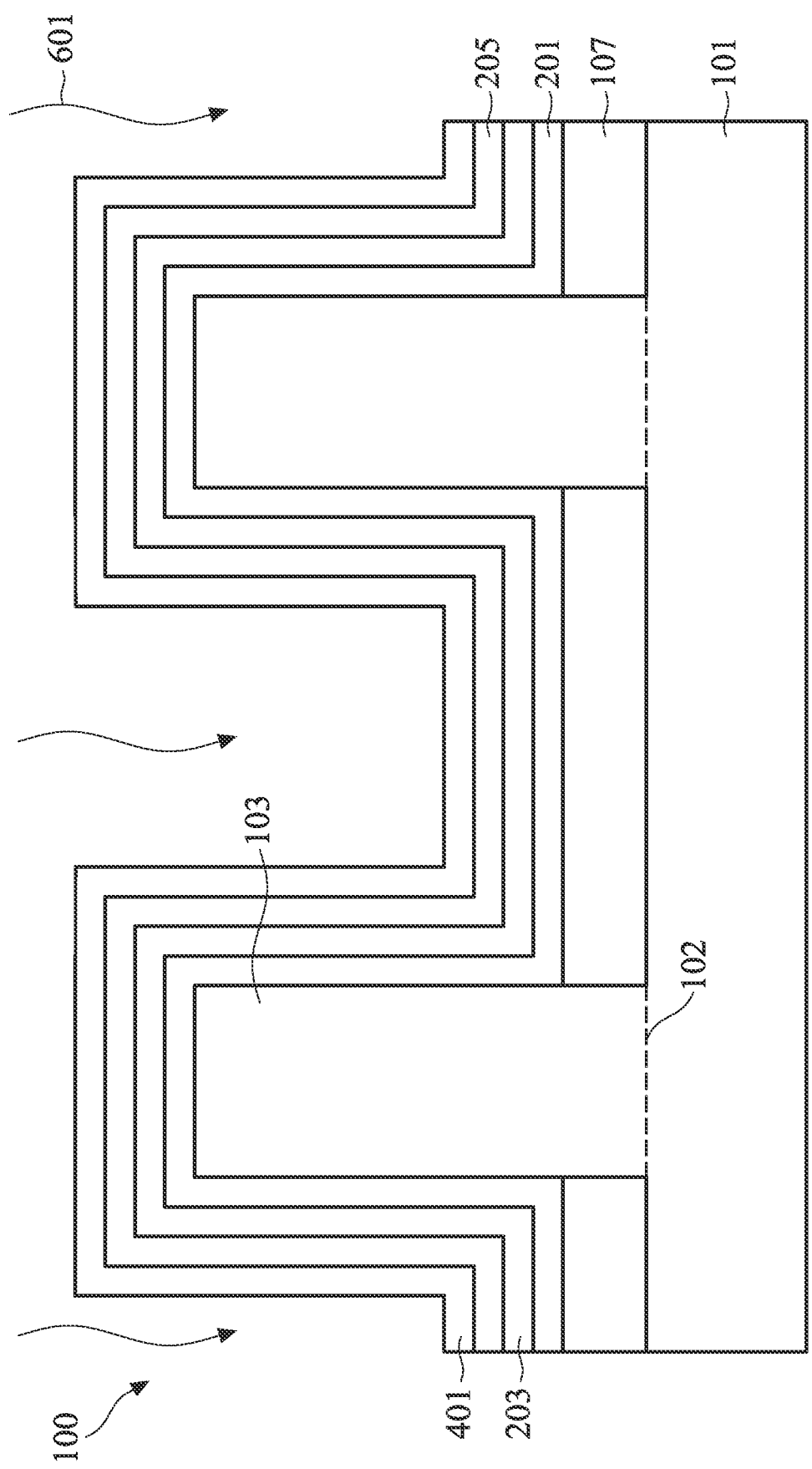
FIG. 6 illustrates a second annealing process in accordance with some embodiments.

FIG. 6 illustrates that, after the first implantation process 501 has been formed, a second anneal process (represented in FIG. 6 by the wavy lines labeled 601) may be performed in order to drive the first dopants from the capping layer 401 and into one or more of the first metal layer 205, the high-k dielectric layer 203, the interfacial layer 201, and the fins 103. In an embodiment the second anneal process 601 may be a spike anneal wherein the substrate 101 is heated within, e.g., a furnace, within an inert atmosphere. The second anneal process 601 may be performed at a temperature of between about 800° C. and about 1000° C., such as about 903° C., and may be continued for a time of between about 0.5 s and about 1 min, such as about 1 sec.

By using the second anneal process 601 the first dopants that were previously implanted into the capping layer 401 may be driven from their location (wherein they were implanted) within the capping layer 401 and into one or more of the first metal layer 205, the high-k dielectric layer 203, the interfacial layer 201, and the fins 103. As such, by utilizing a diffusion process to place the first dopants into the first metal layer 205, the high-k dielectric layer 203, the interfacial layer 201, and the fins 103, a different non-zero concentration gradient is formed within each of the first metal layer 205, the high-k dielectric layer 203, the interfacial layer 201, and the fins 103.

For example, in an embodiment in which the first metal layer 205 is titanium nitride and the first dopant is fluorine, the first metal layer 205 may have a first surface (facing towards the capping layer 401) that has a first concentration of between about $1 \times 10^{20}$/cm$^3$ and about $1 \times 10^{22}$/cm$^3$, such as about $1 \times 10^{21}$/cm$^3$. Additionally, the first metal layer 205 has a second surface (e.g., facing away from the capping layer 401 and towards the high-k dielectric layer 203) which has a second concentration that is lower than the first concentration, such as having a second concentration of between about $1 \times 10^{19}$/cm$^3$ and about $1 \times 10^{21}$/cm$^3$, such as about $1 \times 10^{20}$/cm$^3$, for a concentration gradient through the first metal layer 205 that has a minimum concentration of about $1 \times 10^{21}$/cm$^3$ and a maximum concentration of about $1 \times 10^{20}$/cm$^3$, such as about $5 \times 10^{20}$/cm$^3$. However, any suitable concentration may be utilized.

Also, in embodiments in which the first dopants extend into the high-k dielectric layer 203, a concentration gradient may also be seen in the high-k dielectric layer 203. For example, in an embodiment in which the first dopant is fluorine and the high-k dielectric layer 203 is hafnium oxide, the high-k dielectric layer 203 has a third surface (facing towards the first metal layer 205) that has a third concentration of between about $1 \times 10^{19}$/cm$^3$ and about $1 \times 10^{21}$/cm$^3$, such as about $1 \times 10^{20}$/cm$^3$. Additionally, the high-k dielectric layer 203 has a fourth surface (e.g., facing away from the first metal layer 205) which has a fourth concentration that is lower than the third concentration, such as having a fourth concentration of between about $1 \times 10^{19}$/cm$^3$ and about $1 \times 10^{20}$/cm$^3$, such as about $5 \times 10^{19}$/cm$^3$, for a concentration gradient through the high-k dielectric layer 203 of between about $1 \times 10^{20}$/cm$^3$ and about $5 \times 10^{19}$/cm$^3$, such as about $7 \times 10^{19}$/cm$^3$. However, any suitable concentration may be utilized.

Additionally, in embodiments in which the first dopants extend into the interfacial layer 201, a concentration gradient may also be seen in the interfacial layer 201. For example, in an embodiment in which the first dopant is fluorine and the interfacial layer 201 is silicon dioxide, the interfacial layer 201 has a fifth surface (facing towards the high-k dielectric layer 203) that has a fifth concentration of between about $1 \times 10^{18}$/cm$^3$ and about $1 \times 10^{19}$/cm$^3$, such as about $5 \times 10^{18}$/cm$^3$. Additionally, the interfacial layer 201 has a sixth surface (e.g., facing away from the high-k dielectric layer 203) which has a sixth concentration that is lower than the fifth concentration, such as having a sixth concentration of between about $1 \times 10^{18}$/cm$^3$ and about $1 \times 10^{19}$/cm$^3$, such as about $3 \times 10^{18}$/cm$^3$, for a concentration gradient through the interfacial layer 201 of between about $5 \times 10^{18}$/cm$^3$ and about $3 \times 10^{18}$/cm$^3$, such as about $4 \times 10^{18}$/cm$^3$. However, any suitable concentration may be utilized.

Finally, in embodiments in which the first dopants extend into the fins 103, a concentration gradient may also be seen in the fins 103. For example, in an embodiment in which the first dopant is fluorine and the fins 103 are silicon, the fins 103 have a seventh surface (facing towards the interfacial layer 201) that has a seventh concentration of between about $1 \times 10^{18}$/cm$^3$ and about $1 \times 10^{19}$/cm$^3$, such as about $3 \times 10^{18}$/cm$^3$. Additionally, the concentration of the first dopants within the fins 103 will continue to decrease in a direction away from the seventh surface until the concentration reaches zero. In a particular embodiment the first dopants will diffuse into the fins 103 a distance of between about 1 nm and about 5 nm, such as about 2 nm, for a concentration gradient through the fins 103 of between about $3\times10^{18}/cm^3$ and about $5\times10^{17}/cm^3$, such as about $1\times10^{18}/cm^3$. However, any suitable concentration and depth may be utilized.

By implanting the fluorine into each of the different layers, multiple issues may be resolved simultaneously. For example, with respect to embodiments in which the interfacial layer 201 is silicon dioxide and the fins 103 are silicon, the interface between the silicon dioxide and the silicon can be strengthened. For example, by replacing bonds such as a silicon-hydrogen bond (which may have a bond strength of about 3.18 eV) with bonds that are stronger, such as a silicon-fluorine bond (which may have a bond strength of about 5.73 eV), the bonding between the fins 103 and the interfacial layer 201 may be strengthened. As such, the overall interface passivation will also be strengthened.

Additionally, by diffusing the first dopant (e.g., fluorine) into the high-k dielectric layer 203, the first dopant will also spontaneously passivate oxygen vacancies $V_o$ which can occur within the high-k dielectric layer 203. For example, in an embodiment in which the high-k dielectric layer 203 is hafnium oxide, by spontaneously reacting fluorine that is diffusing through the high-k dielectric layer 203 with oxygen vacancies $V_o$ which are already present, the fluorine will be substituted for the oxygen vacancies $V_o$ in an exothermic reaction that releases 2.5 eV. As such, the number of oxygen vacancies $V_o$ will be reduced or eliminated within the high-k dielectric layer 203, thereby also reducing or eliminating any remaining gap states within the high-k dielectric layer 203.

Finally, by using the divergent ion beam 519 to produce a more conformal implantation into the capping layer 401, and then driving the first dopant into the fins 103, the concentration of the first dopant within the first sidewalls of the fins 103 will see an increase in the concentration of the first dopants. For example, by using the divergent ion beam 519 and processes described above, the concentration of the first dopants along the sidewalls of the fins 103 may be increased between about 3% and about 4% from the sidewall concentration that would be obtained without the divergent ion beam 519. As such, a more conformal doping of the fins 103 (e.g., between the top and sidewalls of the fins 103) may be obtained, such as a conformality of less than about $3\times10^{20}/cm^3$.

By utilizing the first dopant, all of these issues may be resolved or mitigated. As such, the channel resistance ($R_ch$) of devices formed from the fins 103 may see an improvement. For example, in an n-type ultra-low voltage threshold device the channel resistance $R_ch$ may be improved from 1.42 kΩ/fin to about 1.32 kΩ/fin. Additionally, in a p-type ultra-low voltage threshold device, the channel resistance $R_ch$ may be improved from about 2.3 kΩ/fin to about 1.98 kΩ/fin.

Figure 7:
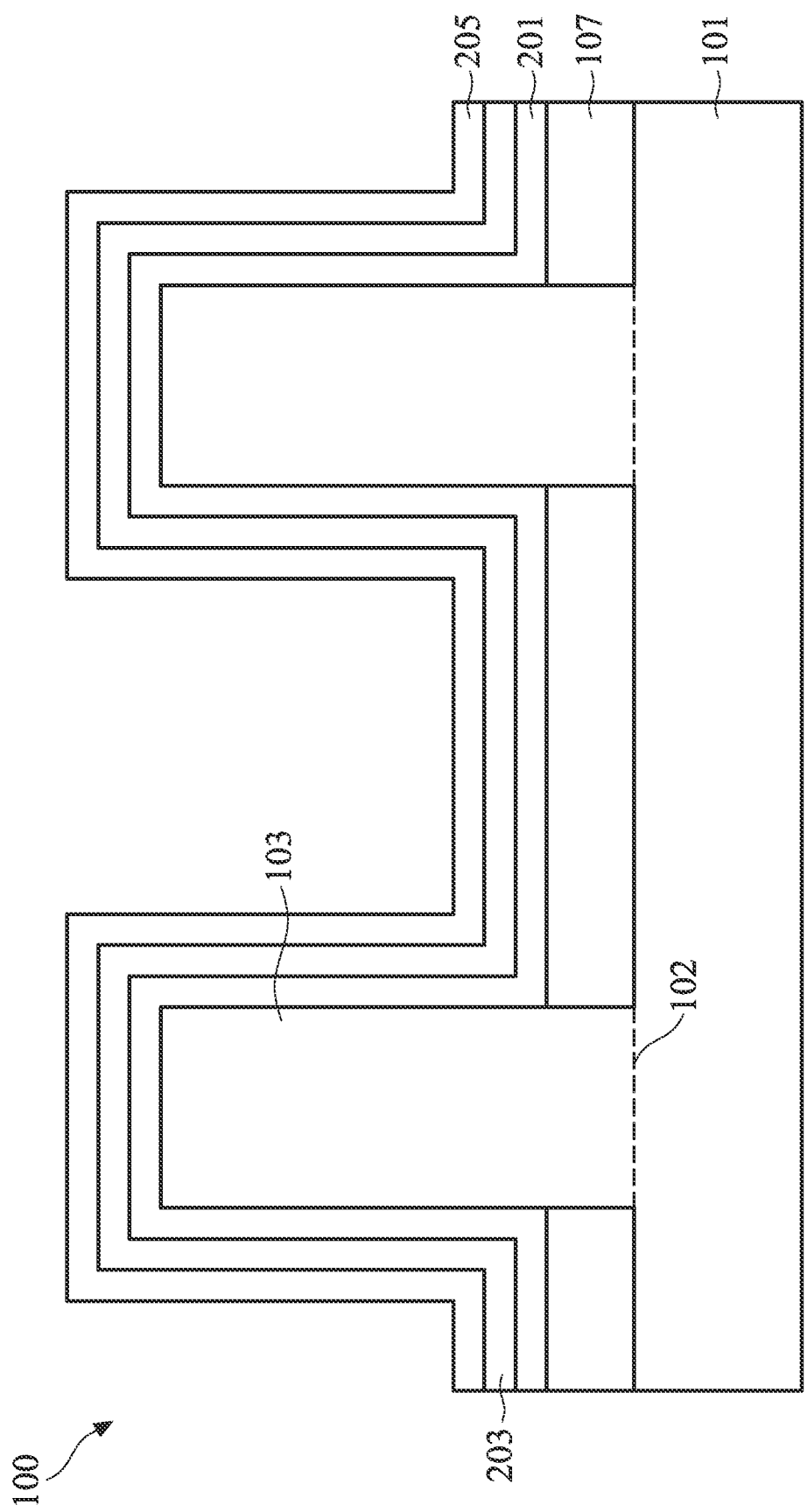
FIG. 7 illustrates a removal of the capping layer in accordance with some embodiments.

FIG. 7 illustrates that, after the second anneal 601 has been performed, the capping layer 401 may be removed. In an embodiment the removal of the capping layer 401 may be performed using, e.g., an etching process such as a wet etching process or dry etching process, which utilizes etchants that are selective to the material of the capping layer 401. For example, in an embodiment in which the capping layer 401 is silicon, the capping layer 401 may be removed using a wet etching process with an etchant such as dilute-HF. However, any suitable removal process may be utilized.

By utilizing the capping layer 401 to receive the implantation of the first dopants and then removing the capping layer 401, damage from the ion implantation process 501 may be avoided within the first metal layer 205, the high-k dielectric layer 203, the interfacial layer 201, and the fins 103 within the final structure of the semiconductor device 100. In particular, any damage from the ion implantation process 501 will be mostly limited to within the capping layer 401, which is subsequently removed after the transference of the first dopants from the capping layer 401.

Optionally, after the diffusion of the first dopants, the fins 103 may be doped in order to form source/drain regions. In an embodiment an n-type dopant or p-type dopant (depending upon the desired device) may be implanted into the fins 103. Additionally, once the n-type dopants or p-type dopants have been implanted, an activation anneal may be performed to activate the p-type and/or n-type dopants that were implanted. In an embodiment the activation anneal may be performed at a temperature of between about 700° C. and about 1000° C., such as about 850° C. However, any suitable temperature may be utilized.

Additionally, once the capping layer 401 has been removed, additional steps may be performed in order to incorporate the structure comprising the fins 103 into a functional, fully connected integrated circuit. For example, metallization layers (not illustrated) may be formed over the fins 103 while contacts (not illustrated) may be dropped down to make electrical connection with the fins 103 and the first metal layer 205, and the overall structure may be utilized to form more complex devices, such as a ring oscillator (RO) or a pulse controlled modulator (PCM). In embodiments in which the fins 103 are incorporated into a ring oscillator, the ring oscillator may see a benefit in DC performance, like $I_{on}$ current, from a base target as measured through an electrical test key of between about 1% (from 70% to about 71%) and about 2%, such as about 1.6% because of the better passivation and higher mobility which reduces the channel resistance of the fins 103.

In an embodiment, a method includes implanting dopants into a capping layer, the capping layer located over a first metal layer, a first dielectric layer, and a semiconductor fin, wherein the implanting the dopants is performed with a divergent ion beam; and driving the dopants from the capping layer into the first dielectric layer through the first metal layer. In an embodiment the driving the dopants further comprises driving the dopants into an interfacial layer located between the first dielectric layer and the semiconductor fin. In an embodiment the dopants comprise fluorine. In an embodiment the divergent ion beam has a beam intensity that is greatest at ±10°. In an embodiment the method further includes removing the capping layer after the driving the dopants from the capping layer into the first dielectric layer. In an embodiment the capping layer comprises silicon. In an embodiment the first dielectric layer comprises hafnium oxide.

In another embodiment, a method of manufacturing a semiconductor device includes forming a fin over a semiconductor substrate; applying a first dielectric layer over the fin; applying a first metal layer over the first dielectric layer; applying a capping layer over the first metal layer; implanting dopants into the capping layer using a divergent ion beam; driving the dopants into the first metal layer; and removing the capping layer. In an embodiment the driving the dopants into the first metal layer is performed at least in part with an anneal. In another embodiment the anneal is a spike anneal. In an embodiment the implanting the dopants into the capping layer damages the capping layer without damaging the first metal layer. In an embodiment the divergent ion beam has a beam intensity that is greatest at ±10°. In an embodiment the first metal layer has a first concentration gradient of the dopants. In an embodiment the first dielectric layer has a second concentration gradient of the dopants different from the first concentration gradient.

In another embodiment, a semiconductor device includes a semiconductor fin over a substrate; an interfacial layer over the semiconductor fin, the interfacial layer having a first non-zero concentration gradient of a first dopant; a high-k dielectric layer over the interfacial layer, the high-k dielectric layer having a second non-zero concentration gradient of the first dopant; and a first metal layer over the high-k dielectric layer, the first metal layer having a third non-zero concentration gradient of the first dopant. In an embodiment the first dopant is fluorine. In an embodiment the interfacial layer comprises silicon oxide. In an embodiment the high-k dielectric layer comprises hafnium oxide. In an embodiment the first metal layer comprises titanium nitride. In an embodiment the high-k dielectric layer is free from implantation damage.

In another embodiment, a method of manufacturing a semiconductor device includes generating an ion beam; modifying a convergence of the ion beam to generate a divergent ion beam; implanting ions from the divergent ion beam into a capping layer, the capping layer being located over a first metal layer and a first dielectric layer; and driving ions from the capping layer into the first metal layer and the first dielectric layer. In an embodiment the divergent ion beam has a beam intensity that is greatest at ±10°. In an embodiment the divergent ion beam comprises fluorine ions. In an embodiment the method further includes removing the capping layer after the driving the ions from the capping layer into the first metal layer.

In another embodiment, a method of manufacturing a semiconductor device includes forming a capping layer over a first metal layer, the first metal layer being over a semiconductor fin; implanting a dopant into the capping layer, wherein after the implanting the dopant into the capping layer, wherein a conformality of a dopant concentration after the implanting the dopant into the capping layer is less than about $3 \times 10^{20}/cm^3$; and annealing the capping layer after the implanting the dopant into the capping layer, wherein the annealing the capping layer drives the dopants through the first metal layer. In an embodiment, during the annealing the capping layer an exothermic reaction occurs in a dielectric layer located between the capping layer and the semiconductor fin. In an embodiment the implanting the dopant is performed with a divergent ion beam.

In another embodiment, a semiconductor device includes a semiconductor fin over a substrate, the semiconductor fin comprising a first element; an interfacial layer over the semiconductor fin, the interfacial layer comprising a second element and a first dopant, the first dopant having a silicon bond strength greater than a bond strength between the first element and the second element; a high-k dielectric layer over the interfacial layer, the high-k dielectric layer having a first concentration gradient of the first dopant; and a first metal layer over the high-k dielectric layer, the first metal layer having a second concentration gradient of the first dopant. In an embodiment the first dopant is fluorine. In an embodiment the high-k dielectric layer is hafnium oxide.

In another embodiment, a semiconductor device includes a semiconductor fin over a substrate; an interfacial layer extending along sidewalls and a top surface of the semiconductor fin, the interfacial layer having a first concentration of a first dopant; a dielectric layer over the interfacial layer, the dielectric layer having a second concentration of the first dopant; and a first metal layer over the dielectric layer, the first metal layer having a third concentration of the first dopant.

In another embodiment, a semiconductor device includes isolation regions over a substrate; a semiconductor fin between adjacent isolation regions; an interfacial layer in physical contact with sidewalls and a topmost surface of the semiconductor fin; a high-k dielectric layer over the interfacial layer; a first metal layer over the high-k dielectric layer; and a first dopant in the semiconductor fin, the interfacial layer, the high-k dielectric layer, and the first metal layer, a concentration of the first dopant in the first metal layer decreasing along a first direction, the first direction extending from a topmost surface of the first metal layer toward the topmost surface of the semiconductor fin.

In another embodiment, a semiconductor device includes: a semiconductor fin over a substrate; and a gate structure over the semiconductor fin, wherein the gate structure includes: a gate dielectric layer extending along sidewalls and a top surface of the semiconductor fin, the gate dielectric layer having a first concentration of a first dopant; and a metal layer over the gate dielectric layer, the metal layer having a second concentration of the first dopant, wherein the second concentration is different from the first concentration.

In another embodiment, a semiconductor device includes: isolation regions over a substrate; a semiconductor fin between adjacent isolation regions; and a gate structure over the semiconductor fin, wherein the gate structure includes: a gate dielectric layer extending along sidewalls and a top surface of the semiconductor fin; a metal layer over the gate dielectric layer; and a first dopant in the gate dielectric layer and the metal layer, where a concentration of the first dopant in the metal layer decreases along a first direction, and where the first direction extends from a top surface of the metal layer toward the top surface of the semiconductor fin.

In another embodiment, a method includes: forming a semiconductor fin over a substrate; and forming a gate structure over the semiconductor fin, wherein forming the gate structure includes: forming a gate dielectric layer along sidewalls and a top surface of the semiconductor fin; forming a metal layer over the gate dielectric layer; forming a capping layer over the metal layer; implanting first dopants into the capping layer; and performing an annealing process to drive the first dopants from the capping layer into the gate dielectric layer through the metal layer, where a concentration of the first dopants in the metal layer decreases along a first direction, and where the first direction extends from a top surface of the metal layer toward the top surface of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a semiconductor fin over a substrate; and
forming a gate structure over the semiconductor fin, wherein forming the gate structure comprises:
  forming a gate dielectric layer along sidewalls and a top surface of the semiconductor fin;
  forming a metal layer over the gate dielectric layer;
  after forming the metal layer, forming a capping layer over the metal layer;
  after forming the capping layer, implanting first dopants into the capping layer; and
  after implanting the first dopants, performing an annealing process to drive the first dopants from the capping layer into the gate dielectric layer through the metal layer, wherein a concentration of the first dopants in the metal layer decreases along a first direction, and wherein the first direction extends from a top surface of the metal layer toward the top surface of the semiconductor fin.

2. The method of claim 1, further comprising, after performing the annealing process, removing the capping layer.

3. The method of claim 1, wherein implanting the first dopants into the capping layer comprises performing an implantation process using a divergent ion beam.

4. The method of claim 1, wherein a concentration of the first dopants in the gate dielectric layer decreases along the first direction.

5. The method of claim 1, further comprising:
before forming the gate dielectric layer, forming an interfacial layer along the sidewalls and the top surface of the semiconductor fin.

6. The method of claim 5, wherein the annealing process drives the first dopants into the interfacial layer.

7. The method of claim 6, wherein a concentration of the first dopants in the interfacial layer decreases along the first direction.

8. The method of claim 1, wherein the first dopants comprise fluorine.

9. A method comprising:
forming a semiconductor fin over a substrate; and
forming a gate structure over the semiconductor fin, wherein forming the gate structure comprises:
  forming an interfacial layer along sidewalls and a top surface of the semiconductor fin;
  forming a gate dielectric layer over the interfacial layer;
  forming a metal layer over the gate dielectric layer;
  after forming the metal layer, forming a capping layer over the metal layer;
  after forming the capping layer, implanting a first dopant into the capping layer; and
  after implanting the first dopant, driving the first dopant from the capping layer into the interfacial layer through the metal layer and the gate dielectric layer, wherein the interfacial layer has a first concentration of the first dopant, wherein the gate dielectric layer has a second concentration of the first dopant different from the first concentration of the first dopant, and wherein the metal layer has a third concentration of the first dopant different from the first concentration of the first dopant.

10. The method of claim 9, wherein implanting the first dopant comprises:
forming a coherent beam of the first dopant;
converting the coherent beam of the first dopant to a divergent beam of the first dopant; and
directing the divergent beam to the substrate.

11. The method of claim 10, wherein the divergent beam has an intensity divergence from parallel of between about ±0.1° to about ±20°.

12. The method of claim 11, wherein the intensity divergence from parallel is ±10°.

13. The method of claim 9, wherein the implanting is performed with a sub-keV implantation process.

14. The method of claim 9, wherein the implanting is performed with a 300 eV implantation process.

15. A method comprising:
forming a semiconductor fin over a substrate; and
forming a gate structure over the semiconductor fin, wherein forming the gate structure comprises:
  depositing an interfacial layer along sidewalls and a top surface of the semiconductor fin, the interfacial layer having a first surface facing toward the semiconductor fin and a second surface facing away from the semiconductor fin;
  depositing a gate dielectric layer over the interfacial layer, the gate dielectric layer having a third surface facing toward the interfacial layer and a fourth surface facing away from the interfacial layer;
  depositing a metal layer over the gate dielectric layer, the metal layer having a fifth surface facing toward the gate dielectric layer and a sixth surface facing away from the gate dielectric layer;
  after depositing the metal layer, depositing a capping layer over the metal layer;
  after depositing the capping layer, implanting a first dopant into the capping layer; and
  after implanting the first dopant, driving the first dopant from the capping layer into the interfacial layer through the metal layer and the gate dielectric layer, the first surface having a first concentration of the first dopant, the second surface having a second concentration of the first dopant, the third surface having a third concentration of the first dopant, the fourth surface having a fourth concentration of the first dopant, the fifth surface having a fifth concentration of the first dopant, the sixth surface having a sixth concentration of the first dopant, the second concentration of the first dopant being greater than the first concentration of the first dopant, the fourth concentration of the first dopant being greater than the third concentration of the first dopant, the sixth concentration of the first dopant being greater than the fifth concentration of the first dopant.

16. The method of claim 15, wherein implanting comprises implanting the first dopant using a divergent beam of the first dopant.

17. The method of claim 16, wherein the first dopant comprises fluorine, carbon, or nitrogen.

18. The method of claim 17, wherein the divergent beam has an intensity divergence from parallel in a range between ±0.1° to ±20°.

19. The method of claim 18, wherein the implanting is a sub-keV implant process.

20. The method of claim 15, wherein driving the first dopant reduces oxygen vacancies and gap states in the gate dielectric layer.

* * * * *